(12) United States Patent
Bonitz

(10) Patent No.: US 6,281,720 B1
(45) Date of Patent: Aug. 28, 2001

(54) ELECTRIC INTEGRATED CIRCUIT

(75) Inventor: Rainer Bonitz, Bad Aibling (DE)

(73) Assignee: STMicroelectronics GmbH, Grasbrunn (DE)

( * ) Notice: Subject to any disclaimer, the term of this patent is extended or adjusted under 35 U.S.C. 154(b) by 0 days.

(21) Appl. No.: 09/534,254

(22) Filed: Mar. 23, 2000

(30) Foreign Application Priority Data

Mar. 23, 1999 (DE) .............................................. 199 13 140

(51) Int. Cl.⁷ ................................. H03B 1/00; H03K 3/00
(52) U.S. Cl. .................... 327/108; 327/112; 327/323; 327/374; 326/21; 326/27; 326/83
(58) Field of Search ........................ 327/108–112, 323, 327/427, 170, 374–377, 403–406; 326/26–28, 82, 83, 86, 87, 21–24

(56) References Cited

U.S. PATENT DOCUMENTS

| | | | |
|---|---|---|---|
| 4,877,980 | * 10/1989 | Kubinec | 327/427 |
| 5,111,076 | * 5/1992 | Tarng | 326/27 |
| 5,124,579 | * 6/1992 | Naghshineh | 326/27 |
| 5,315,187 | * 5/1994 | Cheng | 326/27 |
| 5,369,316 | * 11/1994 | Chen et al. | 326/83 |
| 5,894,238 | * 4/1999 | Chien | 327/112 |
| 5,929,654 | * 7/1999 | Park et al. | 326/27 |

FOREIGN PATENT DOCUMENTS

4421419A1  12/1995  (DE) .

* cited by examiner

Primary Examiner—Terry D. Cunningham
Assistant Examiner—Long Nguyen
(74) Attorney, Agent, or Firm—Theodore E. Galanthay; E. Russell Tarleton; Seed IP Law Group PLLC

(57) ABSTRACT

A circuit arrangement which, in accordance with its mode of control, operates either as input circuit or as output circuit and includes a series connection with an inverter stage, a filter stage, a cross-current avoiding stage, a switching-on voltage reducing stage, a switch stage, an output driver stage, and a Miller feedback stage, which are configured in the mode of operation as an output circuit, and parallel thereto a Schmitt trigger and an analog switch that can become effective in the mode of operation as input circuit.

20 Claims, 12 Drawing Sheets

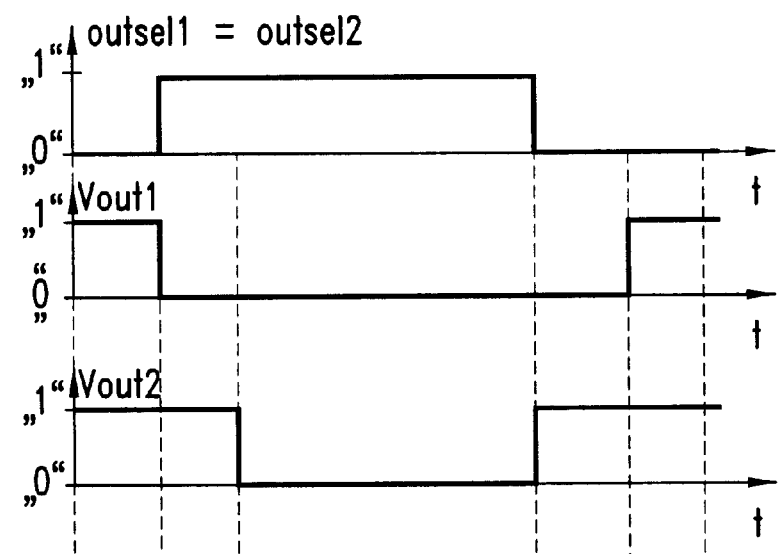
*Fig. 7*
*Fig. 8*
*Fig. 9*
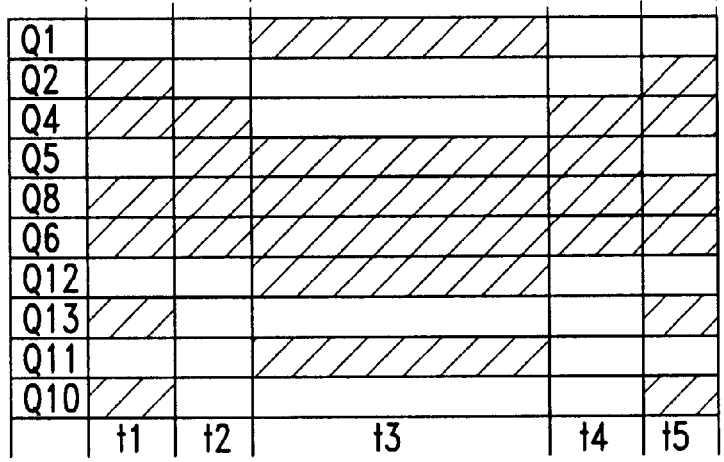
*Fig. 10*

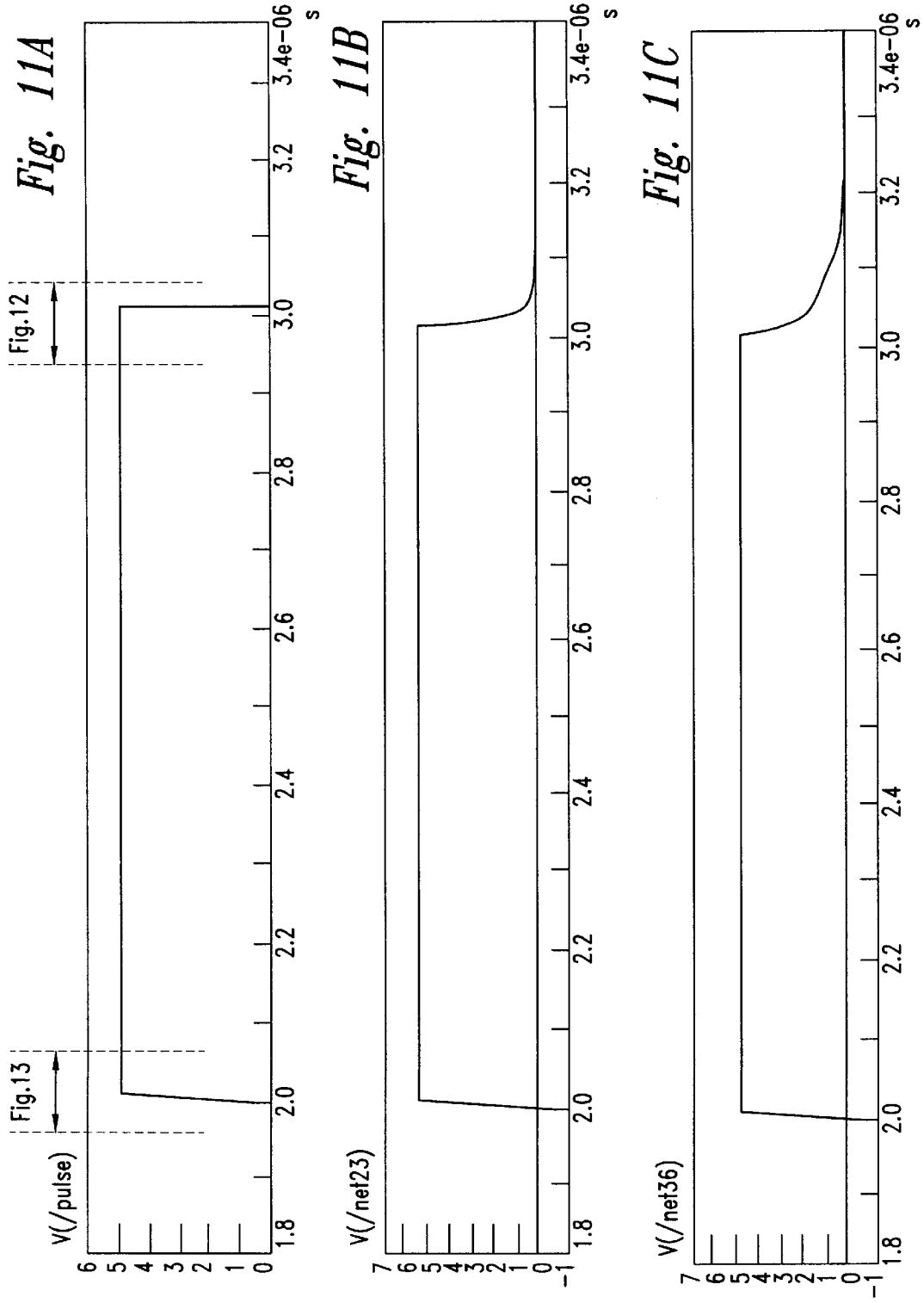

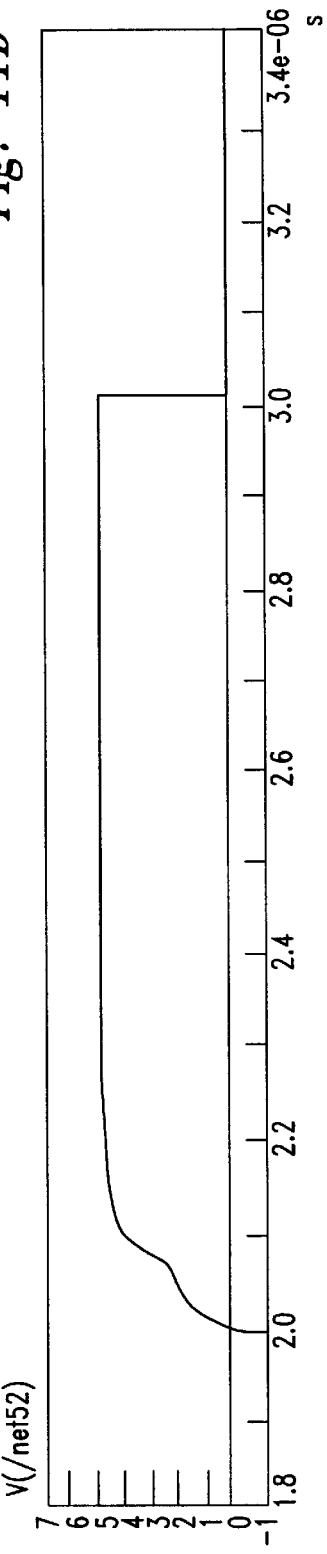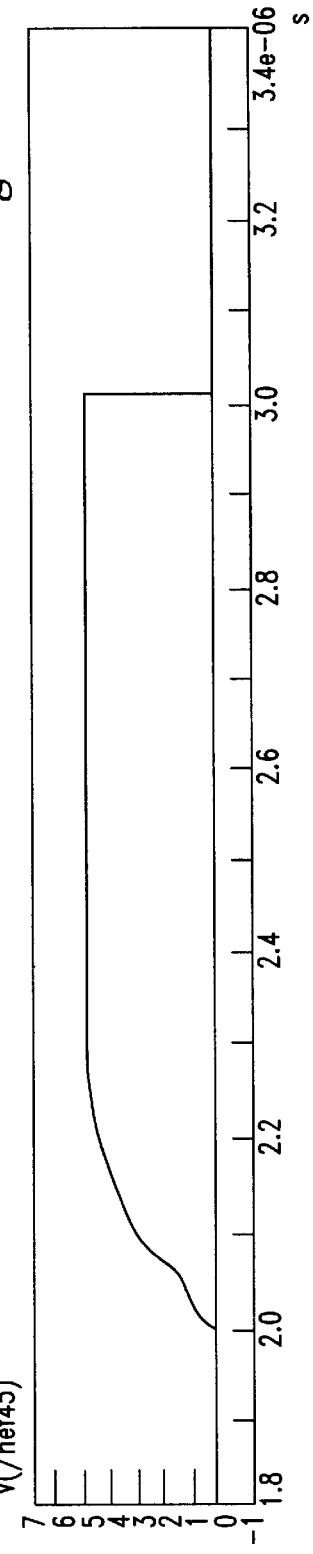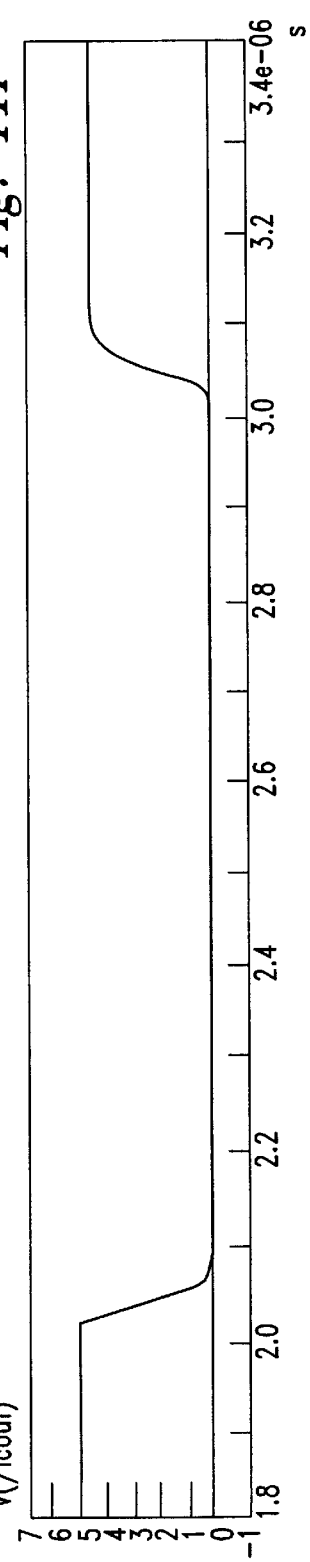

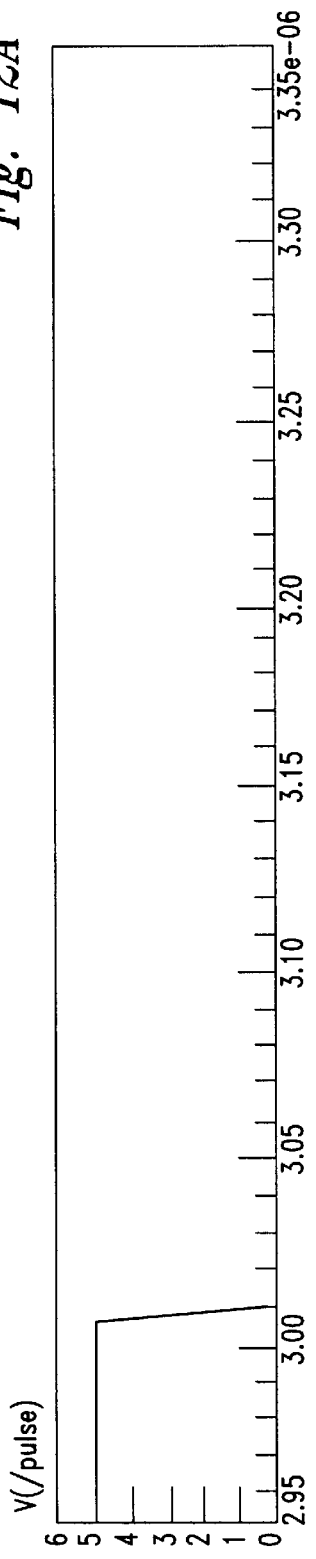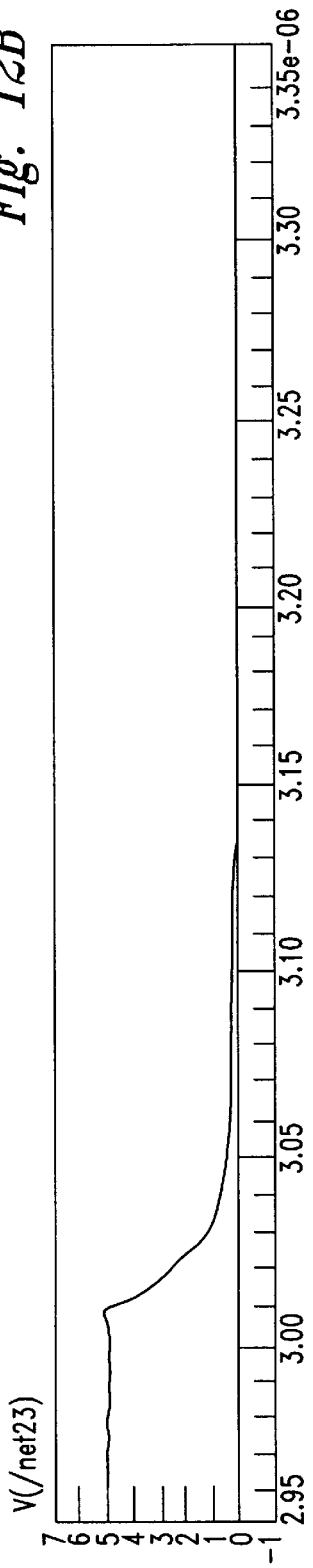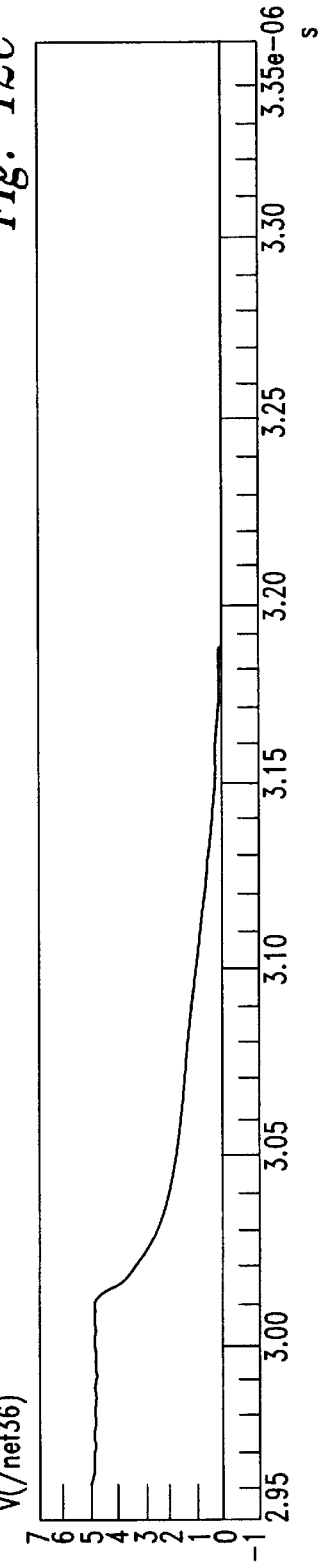

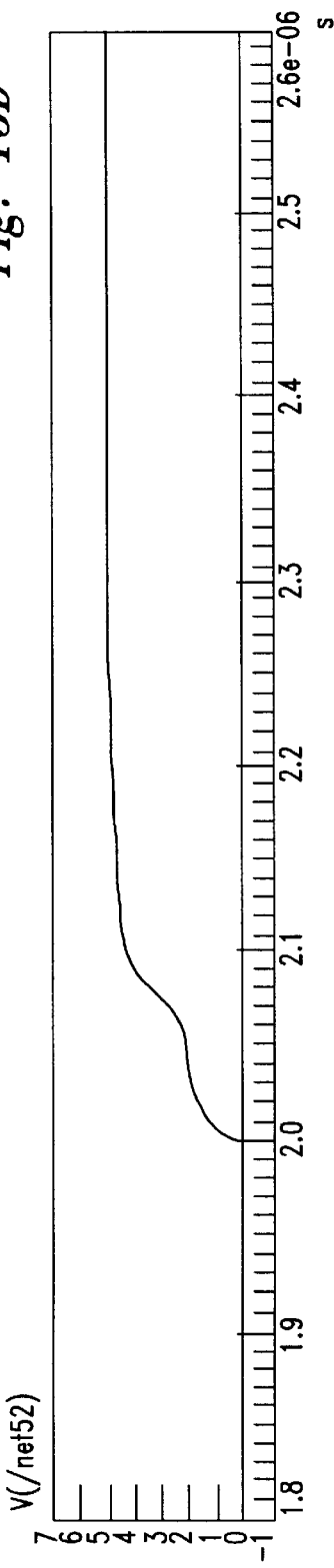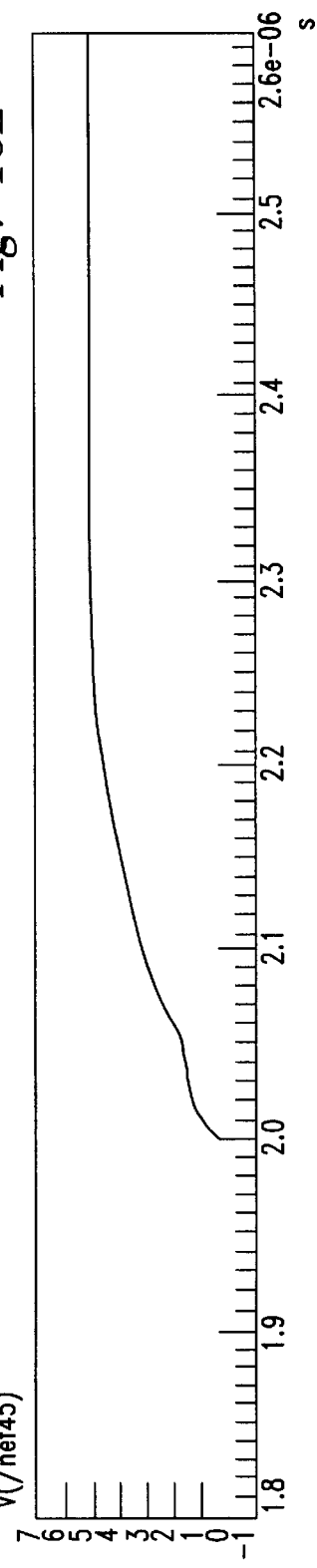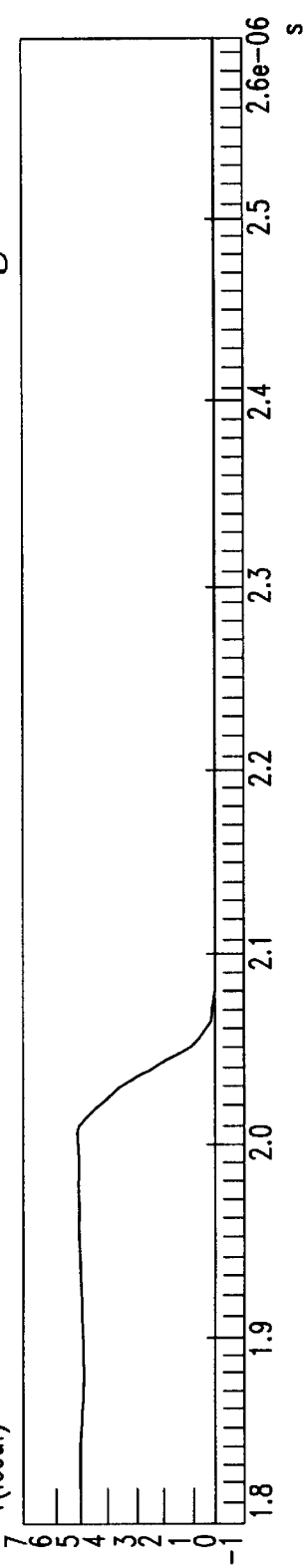

ELECTRIC INTEGRATED CIRCUIT

TECHNICAL FIELD

The invention relates to an electric integrated circuit comprising a CMOS output driver stage which is controllable by means of switching control pulses of control signal sources.

BACKGROUND OF THE INVENTION

In many applications care must be taken that a circuit with a CMOS output driver displays neither too strong emission of electromagnetic interference radiation nor too much sensitivity with respect to incoming electromagnetic interference radiation.

SUMMARY OF THE INVENTION

With the disclosed embodiments of the present invention an integrated circuit with CMOS output driver stage is made available that achieves considerable improvement in the electromagnetic compatibility (EMC) behavior.

An integrated circuit according to the embodiments of the invention provides a switching-on voltage reducing stage in the integrated circuit that results in switching of the output driver stage with soft edges and correspondingly low electromagnetic interference radiation. This is achieved by superimposition of the forward behavior of MOS transistors connected in parallel, of which one, in the on-state, acts virtually like an ohmic resistor and the other one is of low on-state forward resistance, while however due to the fact that its gate is connected to the gate terminal of the respective other driver transistor, it reaches the conducting state with a delay that is dependent on the change in gate potential of this particular other driver transistor during switching operations. In this manner, soft edge transitions are obtained without the necessity of additional external (outside the IC) filter circuits.

The softness of the switching edges of the driver transistors can be enhanced further by arranging several low-impedance transistors in series connection and connecting the high-impedance parallel transistor in parallel with this entire series connection.

The degree of edge softness can also be made programmable in that at least one of the low-impedance transistors has a bridging switching transistor connected in parallel thereto by means of which the bridged transistor can be switched into the effective or ineffective state. Another configuration with respect to the programmability of the edge softness consists in rendering at least one of the low-impedance transistors programmable either in a diode circuit or in designing it to be permanently conductive.

Electromagnetic interference is also generated in that between the supply voltage terminals of the integrated circuit, there are flowing pulse-shaped cross-currents during switching operations. This is prevented with a preferred embodiment of the circuit according to the invention in that an inverter stage and a cross-current avoiding stage following the same are connected between the control signal source and the switching-on voltage reducing circuit. The inverter stage includes two CMOS inverter stages connected in parallel, and in each inverter stage one of the two CMOS transistors is designed as fast switching transistor and the other one of the two CMOS transistors is designed as slow switching transistor, with the high-potential side P-channel transistor of the one inverter and the low-potential side N-channel transistor of the other inverter being designed as a fast switching transistor and the respective other one as slow a switching transistor. The cross-current avoiding stage comprises a series connection connected between the two supply voltage terminals and including a high-potential side MOS transistor of a first channel type, a low-potential side MOS transistor of the opposite channel type and therebetween a parallel connection including two MOS transistors of different channel type. The high-potential side MOS transistor and the MOS transistor of the parallel connection of opposite channel type are controlled by the output of the one inverter, while the low-potential side MOS transistor and the other MOS transistor of the parallel connection are controlled by the output of the second inverter. The dimensioning of the inverters, which is asymmetrical with respect to the switching speeds, has the effect that during switching control of the output driver stage, there is never created a conducting path between the two supply voltage terminals over the cross-current avoiding stage, but rather, feeding of the high supply voltage potential and the low supply voltage potential, respectively, to the gate of the low-potential side driver transistor and the high-potential side driver transistor, respectively, always takes place only via the low-potential side MOS transistor and one of the two MOS transistors of the parallel connection and via the high-potential side MOS transistor and the other one of the two parallel MOS transistors, respectively, there being always at least one transistor of the high-potential side and low-potential side transistor pair on the one hand and of the two parallel-connected transistors on the other hand in the blocking state.

The dimensioning of the inverter transistors as fast or slow switching MOS transistors is effected via the dimensioning of their ratio of channel width to channel length.

An additional measure for avoiding cross-currents through the two driver transistors consists in a switch stage inserted between the switching-on voltage reducing circuit and the output driver stage. This switch stage includes two switching transistors which are each connected between the gate of one of the two driver transistors and the high-potential side and low-potential side supply voltage terminal, respectively, and which are controlled by one of the two inverters each. Due to the asymmetrical dimensioning of the two inverters, switching over of the driver stage has the effect that switching off of the respective driver transistor to be switched off takes place rapidly and switching on of the respective other driver transistor to be switched on takes place slowly, so that cross-currents across the series connection of the two driver transistors are thus avoided.

In an embodiment of the invention, the edge steepness of the output signal of the output driver stage is reduced in addition with the aid of a feedback stage for each of the two driver transistors. Each of the two feedback stages comprises a Miller feedback circuit which effects a reduction in edge steepness under the influence of the Miller capacitance. Programmability preferably exists in so far as the feedback stages are switchable in feedback-effective and feedback-ineffective manner, so that different signal edge steepnesses can be set at the output of the output driver stage.

To make electromagnetic interferences innocuous that enter via the supply voltage lines, an embodiment of the invention comprises a filter stage between the control signal source and the switching-on voltage reducing stage. This filter stage is preferably composed with series inductances and series resistors and shunt capacitances.

The integrated circuit according to the embodiments of the invention can be conceived both as output circuit and as input circuit, with an output/input terminal of the integrated circuit issuing either output driver pulses of the output driver stage as output signals or with input signals being input via this terminal which are passed from the terminal to an input of a Schmitt trigger and to the input of an analog switch. In a preferred embodiment the Schmitt trigger has two independently adjustable threshold values. The Schmitt trigger can thus be matched as to whether the signal incoming a the terminal contains high noise and high interference peaks or low noise and low interference peaks. In case of operation of the overall circuit as an output stage, the Schmitt trigger should be provided with an additional input (enable) to avoid cross-currents in the Schmitt trigger (during level change at inout).

The analog switch can be designed in accordance with DE 37 17 922 C2. Such an analog switch has two shunt branches with a series connection of two P-channel MOS transistors in the one shunt branch and a series connection of two N-channel MOS transistors in the second shunt branch, with each shunt branch having a circuit node connected between the two MOS transistors by means of a further MOS transistor of opposite channel type to that of the high-potential side and low-potential side supply voltage terminal, respectively, if the analog switch is not switched to the conducting state. In this manner interference signals are prevented from being transmitted via the switched off analog switch. Interference signal transmissions during the switched-on state of the analog switch can be made innocuous in both directions with the aid of a passive internal filter network.

To keep the effects of interference signals appearing on supply voltage lines as low as possible, a preferred embodiment of the invention provides that the circuit part delivering output signals to the terminal of the integrated circuit and the circuit parts fed with input signals via the terminal have separate voltage supply lines.

It is to be noted here that the inverter stage with two inverters of asymmetrical construction of the type mentioned, in particular together with the afore-mentioned cross-current avoiding stage, the switching-on voltage reducing stage, the edge steepness reduction by way of the afore-mentioned feedback circuit as well as the provision of separate supply voltage lines for the output part of the circuit according to the invention on the one hand and the input parts of this circuit on the other hand each have independent inventive quality independently of the other circuit parts.

BRIEF DESCRIPTION OF THE DRAWINGS

Embodiments of the invention will now be elucidated in more detail by way of drawings wherein

FIG. 7 shows an example of a pulse-shaped signal that can be supplied to the input of the inverter stage shown in FIG. 6, if outsel 1 and 2 are driven in phase agreement;

FIG. 8 shows a pulse response of the upper inverter of the inverter stage to the input pulse illustrated in FIG. 7;

FIG. 9 shows a pulse response of the lower inverter of the inverter stage to the input pulse illustrated in FIG. 7;

FIG. 10 shows a representation indicating for a series of the transistors shown in FIG. 1 whether they are conducting or not conducting during the individual periods of time of FIGS. 7 to 9;

FIGS. 11A–11F show pulse patterns at different locations of the circuit shown in FIG. 2;

FIGS. 12A–12F show the descending edges of the pulses shown in FIG. 11, with enhanced time resolution; and FIGS. 13A–13F show the ascending edges of the pulses shown in FIG. 11, with enhanced time resolution.

DETAILED DESCRIPTION OF THE INVENTION

Figure 1:
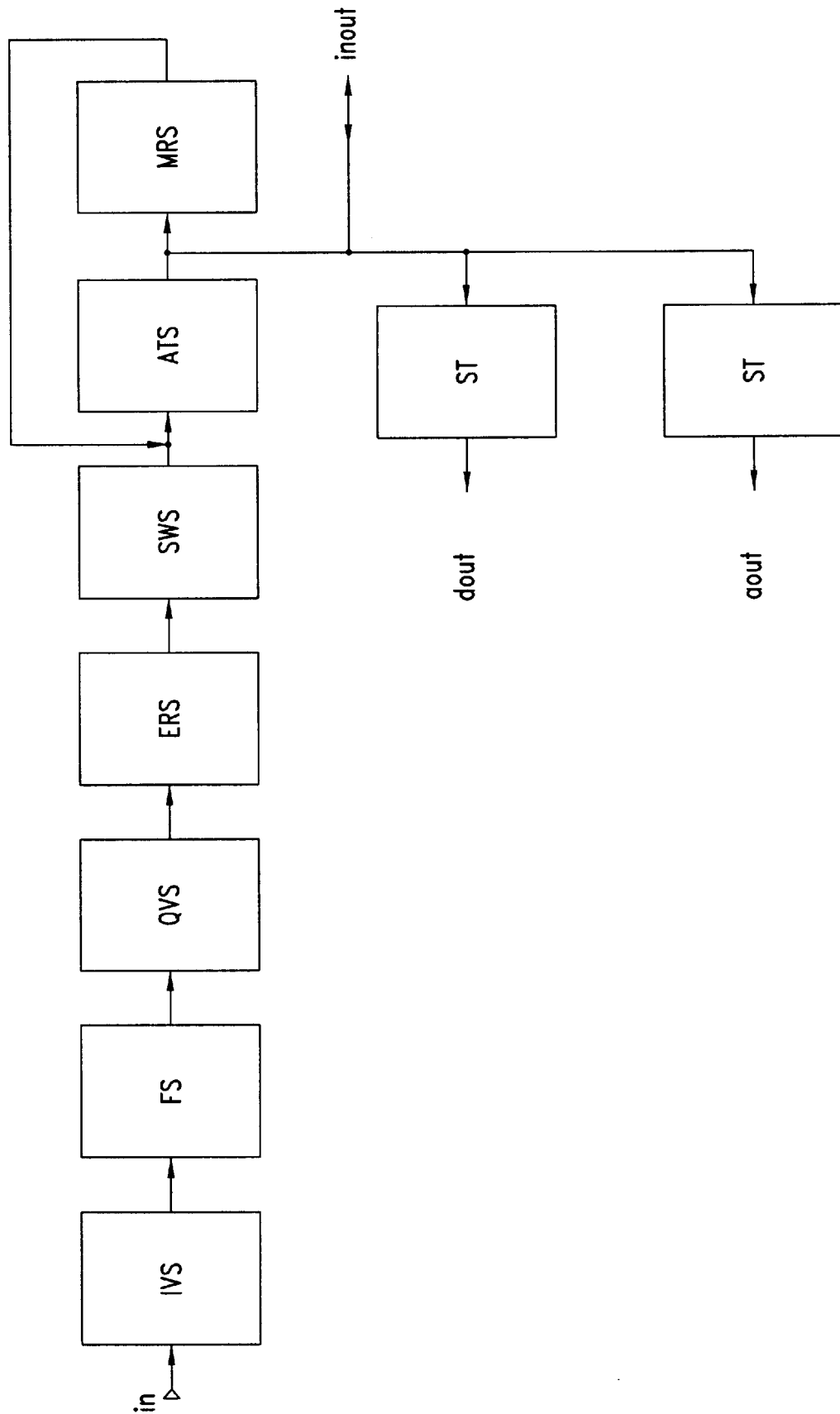
FIG. 1 shows a block circuit diagram of an integrated circuit according to the invention.

An embodiment of an integrated circuit according to the invention is shown in FIG. 1 in a block diagram.

A terminal "inout" of the circuit, depending on the mode of operation thereof, can act as output terminal or as input terminal. As output terminal, inout is effective for the upper circuit part which, between an input signal terminal "in" and the terminal inout, comprises a series connection including an inverter stage IVS, a filter stage FS, a cross-current avoiding stage QVS, a switching-on voltage reducing stage ERS, a switch stage SWS, an output driver stage ATS, and a Miller feedback stage MRS. A connection point between ATS and MRS is connected to inout, and the output of MRS is fed back to the input of ATS. For the lower circuit part including a Schmitt trigger ST and an analog switch AS, terminal inout acts as input terminal. Digital signals incoming via inout are passed via Schmitt trigger ST to a digital output dout, whereas analog signals incoming via inout reach an analog output aout via analog switch AS.

Figure 2A:
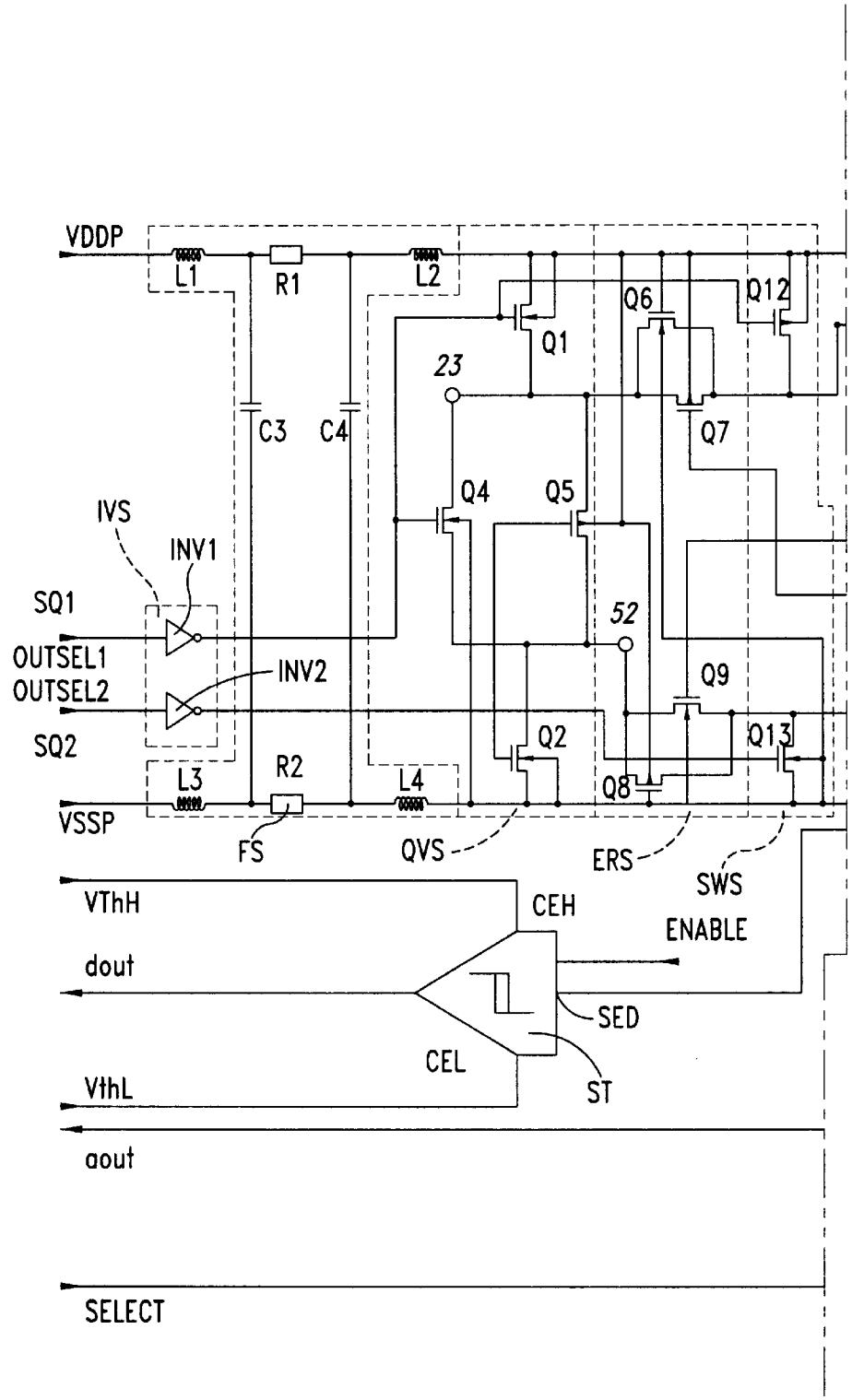
FIG. 2 shows a circuit diagram of the integrated circuit illustrated in FIG. 1.
Figure 2B:
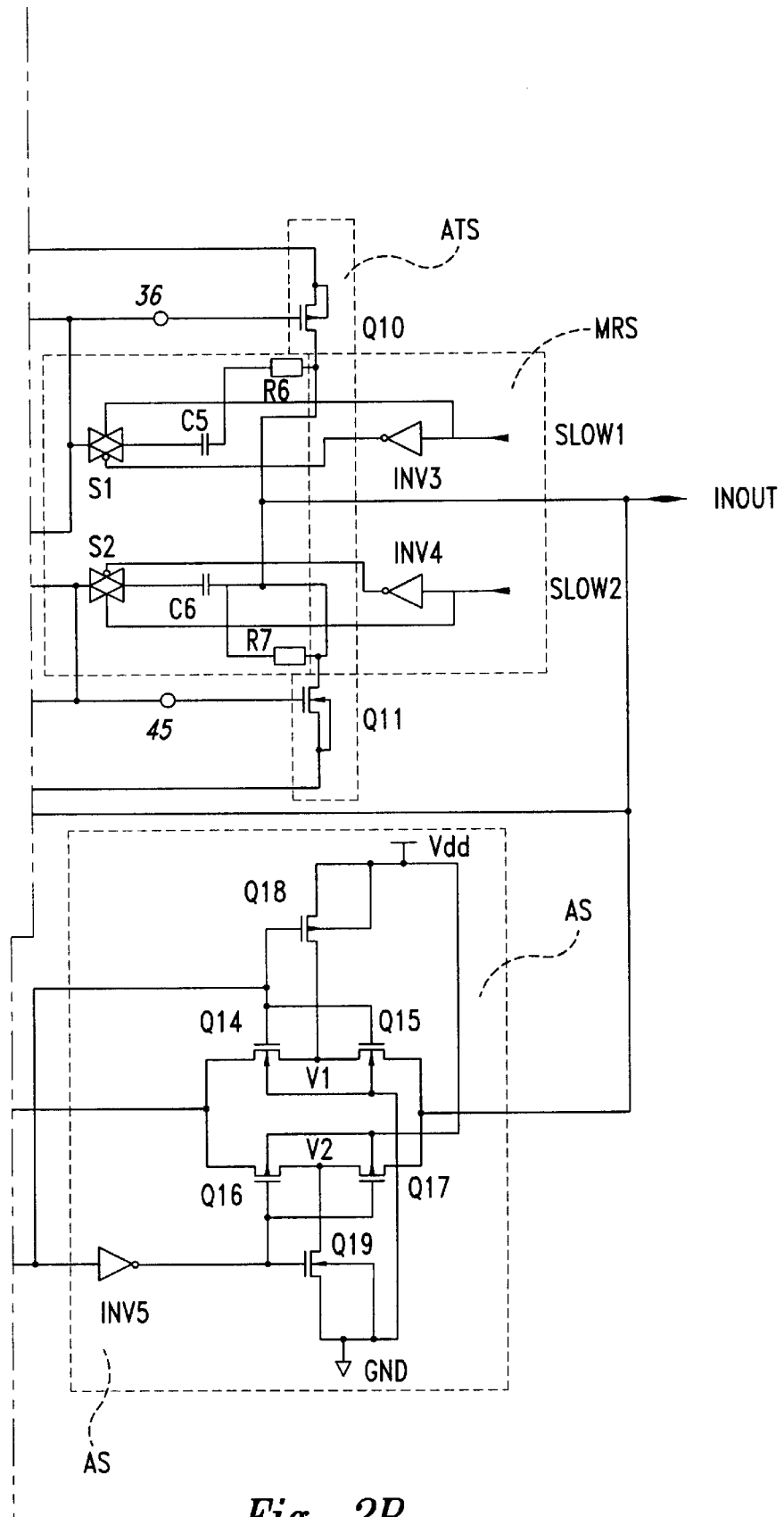

A detailed circuit diagram of the circuit shown in FIG. 1 is depicted in FIG. 2.

Inverter stage IVS comprises a first inverter INV1 and a second inverter INV2 connected in parallel thereto, having inputs in1 and in2 and outputs out1 and out2, respectively. Shown in broken lines is a connection of in1 and in2 to a common input terminal in. Normally the two inputs in1 and in2 are controlled identically, if the upper circuit part in FIG. 1 is put into operation and inout acts as output terminal. If in contrast thereto, terminal inout is operated as input terminal and a digital or analog input signal is passed from inout to Schmitt trigger ST or analog switch AS, respectively, i.e., if the upper circuit part thus is not operated, inputs in1 and in2 of inverter stage IVS receive different control signals. The consequence hereof is that the connection point of the output driver stage ATS, to which terminal inout is connected, is in a high-impedance state. This renders possible signal supply via terminal inout either to the Schmitt trigger ST or to the analog switch AS.

The upper circuit part in FIG. 2 comprises a high-potential side supply voltage terminal VDDP and a low-potential side supply voltage terminal VSSP. The filter stage FS comprises a first series branch connected to VDDP and having a series connection of a first inductance L1, a first resistor R1 and a second inductance L2. A second series branch of filter stage FS, which is connected to VSSP, comprises a series connection of a third inductance L3, a second resistor R2 and a fourth inductance L4. Filter circuit FS comprises furthermore two shunt branches including a third capacitor C3 and a fourth capacitor C4, respectively, with these two shunt branches extending between connection points between L1, R1 and L3, R2 as well as between R1, L2 and R2, L4, respectively.

Filter stage FS is followed by cross-current avoiding stage QVS comprising a series connection connected between VDDP and VSSP and including a high-potential side MOS transistor Q1, a low-potential side MOS transistor Q2 and therebetween a parallel connection with two MOS transistors Q4 and Q5. Gate terminals of Q1 and Q4 are connected to output out1 of inverter INV1 and gate terminals of transistors Q2 and Q5 are connected to output out2 of inverter INV2.

QVS is followed by the switching-on voltage reducing stage ERS comprising a high-potential side parallel connection with transistors Q6, Q7 and a low-potential side parallel connection with transistors Q8, Q9. The gate terminals of Q6 and Q8 are connected to the high-potential side supply voltage terminal VDDP and the low-potential side supply voltage terminal VSSP, respectively. Via the high-potential side parallel connection Q6, Q7, a network point 23 between Q1 and Q4 is connected to the gate terminal of a high-potential side driver transistor Q10 of the output driver stage ATS. Via the low-potential side parallel connection Q8, Q9, a network point 52 between Q2 and Q5 is connected to the gate terminal of a low-potential side driver transistor Q11 of the output driver stage ATS.

Between ERS and ATS there is provided switch stage SWS having a high-potential side switch transistor Q12 and a low-potential side switch transistor Q13. The main path of Q12 is connected between VDDP and a connecting line between highpotential side parallel connection Q6, Q7 and resistor R3. The main path of Q13 is connected between VSSP and a connecting line between low-potential side parallel connection Q8, Q9 and resistor R5. The gate terminals of Q12 and Q13 are connected to output out1 of inverter INV1 and output out2 of inverter INV2, respectively.

The driver transistors Q10 and Q11 form a series connection that is connected between VDDP and VSSP, with a connection point between Q10 and Q11 being connected to terminal inout of the circuit.

In the embodiment of the circuit according to the invention as shown in FIG. 2, all transistors are designed as MOS transistors. Transistors Q1, Q5, Q7, Q8, Q10, and Q12 are designed as P-channel MOS transistors and transistors Q2, Q4, Q6, Q9, Q11, and Q13 as N-channel MOS transistors.

Transistors Q1, Q2, Q7, Q9, Q12, and Q13 are designed as rapid switching transistors with low on-state forward resistance, and to this end they are provided with a large ratio of channel width to channel length. Transistors Q4, Q5, Q6, and Q8 are designed as slow switching transistors with high on-state forward resistance, and to this end they are provided with a small ratio of channel width to channel length. Q6 and Q8 are not used as switches, but as voltage-dependent resistors.

The Miller feedback stage MRS comprises for each of the two driver transistors Q10 and Q11 a series connection connected between the terminal inout and the gate terminal of the respective driver transistor Q10, Q11 and including a feedback resistor R6 and R7, respectively, that is connected to terminal inout, a feedback capacitor C5 and C6, respectively, and an electronic switch S1 and S2, respectively, via which the respective feedback capacitor C5 and C6, respectively, can be connected to the gate terminal of the associated driver transistor Q10 and Q11, respectively. The circuit symbol chosen for the electronic switches S1 and S2 indicates a parallel connection of a P-channel MOS transistor and an N-channel MOS transistor. It is possible to program, via terminals slow1 and slow2, whether the two Miller feedback circuits should be activated or not activated. In the activated state, the associated electronic switch S1 and S2, respectively, is switched to the conducting state and the respective Miller feedback circuit is in the edge-steepness reducing feedback mode of operation. If the electronic switches S1 and S2 are switched to the blocking state, the feedback operation is blocked and no further edge steepness reduction takes place by means of the Miller feedback circuits. To obtain the effect that the two parallel-connected MOS transistors of the electronic switches S1 and S2 are each controlled to the conducting or non-conducting state simultaneously, the control signals supplied via programming inputs slow1 and slow2 are fed to one of the two parallel-connected MOS transistors directly and to the other one via an inverter INV3 and an inverter INV4, respectively.

The Schmitt trigger comprises a signal input SED for digital input signals that is connected to inout, as well as an output SAD for digital output signals. Moreover, the Schmitt trigger has two control inputs CEH and CEL, via which a control signal VthH and a control signal VthL, respectively, can be supplied, by means of which the Schmitt trigger ST can be switched over into a condition with high triggering threshold value and into a condition with low triggering threshold value, respectively. It is possible in this manner to provide for matching to the noise and peak interference intensities of the input signal incoming via terminal inout.

In addition thereto, Schmitt trigger ST has an input enable via which the Schmitt trigger can be activated or deactivated.

Analog switch AS contains two parallel-connected series connections with two N-channel MOS transistors Q14, Q15 in the one parallel branch and two P-channel MOS transistors Q16, Q17 in the other parallel branch. A connection point V1 between Q14 and Q15 is connected via a P-channel MOS clamping transistor Q18 to a highpotential side supply voltage terminal Vdd, whereas a connection point V2 between Q16 and Q17 is connected via an N-channel MOS clamping transistor Q19 to a ground terminal GND. Analog switch AS can be activated or deactivated via a control input select. To this end, the control signal incoming via select is passed to the gate terminals of Q14, Q15 and Q18 directly and to the gate terminals of Q16, Q17 and Q19 via an inverter INV5. In the activated state, transistors Q14, Q15, Q16, and Q17 are rendered conducting and clamping transistors Q18, Q19 are rendered non-conducting. In the deactivated state, transistors Q14, Q15, Q16, and Q17 are rendered non-conducting and clamping transistors Q18 and Q19 are rendered conducting. In the first-mentioned case, an analog signal incoming via terminal inout can be passed through analog switch AS so as to reach an input terminal analog in for subsequent analog circuit parts. In the deactivated state, analog switch AS does not allow signals to pass, and interference signals are not allowed to pass due to the clamping of V1 and V2 via clamping transistors Q18 and Q19.

Figure 3:
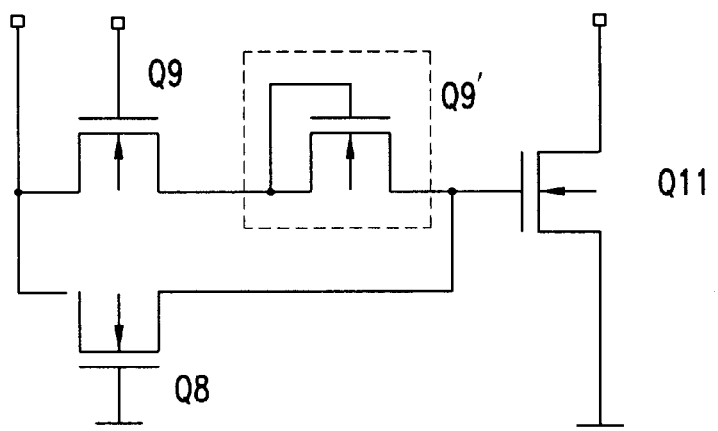
FIG. 3 shows a modification of the parallel circuits, shown in FIG. 2, of the switching-on voltage reducing stage of the circuit according to the invention.
Figure 4:
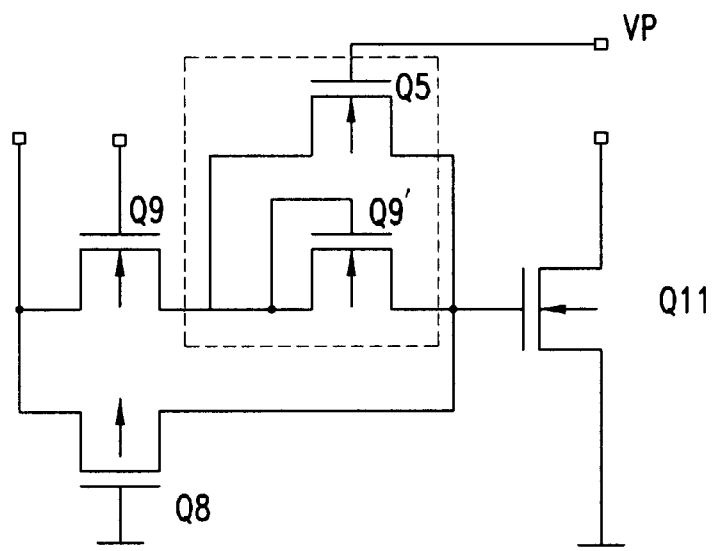
FIG. 4 shows a first programmable modification f of the switching-on voltage reducing stage.
Figure 5:
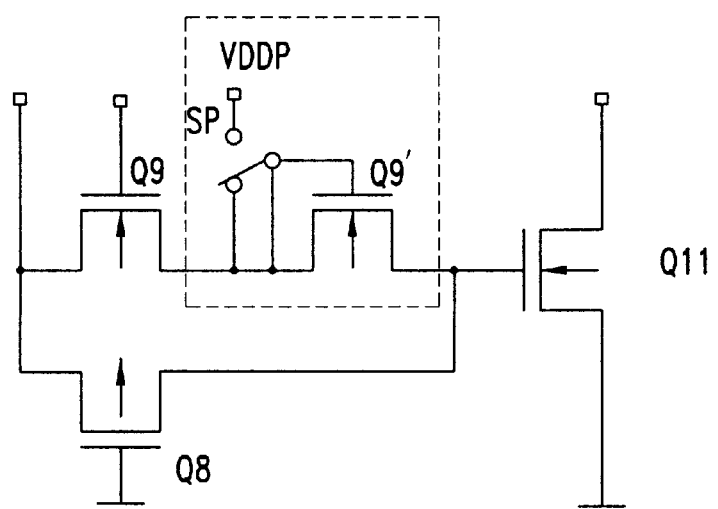
FIG. 5 shows a second programmable modification of the parallel connections of the switching-on voltage reducing stage.

FIGS. 3 to 5 illustrate modifications of the transistor parallel connections used in the switching-on voltage reducing stage. Shown in each thereof is the lower parallel connection containing transistors Q8 and Q9 in FIG. 2.

In the modification shown in FIG. 3, transistor Q8 has connected in parallel thereto a series connection including transistor Q9 and a transistor Q9' connected as a diode.

The modifications shown in FIGS. 4 and 5 are electrically programmable.

In the modification shown in FIG. 4, transistor Q9' connected as diode has a bridging transistor QS connected in parallel thereto, which by means of a programming voltage Vp supplied to its gate can be switched either to the conducting or the non-conducting state. In the conducting state, it bridges Q9' and thus renders Q9' ineffective, whereas in the non-conducting state it takes no influence on the function of Q9'.

In the modification shown in FIG. 5, Q9', via a programming switch Sp, can be brought either into a diode state or into a state in which Q9' is rendered conducting with low forward resistance. To this end, the gate of Q9' can be applied, via programming switch Sp, to high potential, for instance of the high-potential side supply voltage terminal VDDP.

The circuit blocks shown in broken lines in FIGS. 3 to 5, instead of the circuit elements shown in these figures, can also be constituted by programmable EPROM, FLASH, EEPROM transistors with additional circuit inputs and logic circuits for programming.

Figure 6:
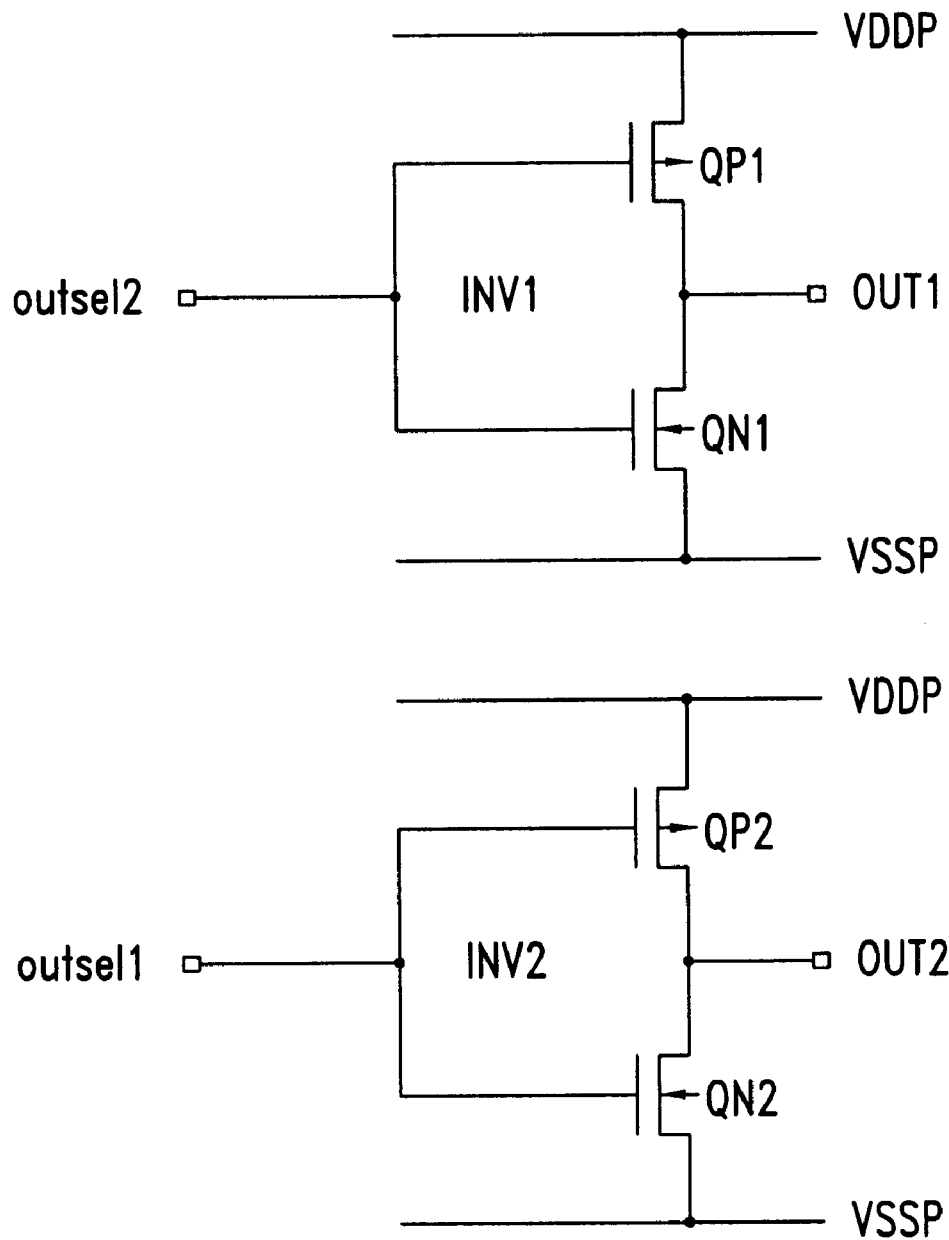
FIG. 6 shows an embodiment of an asymmetrical inverter stage of the circuit according to the invention.
Figure 12D:
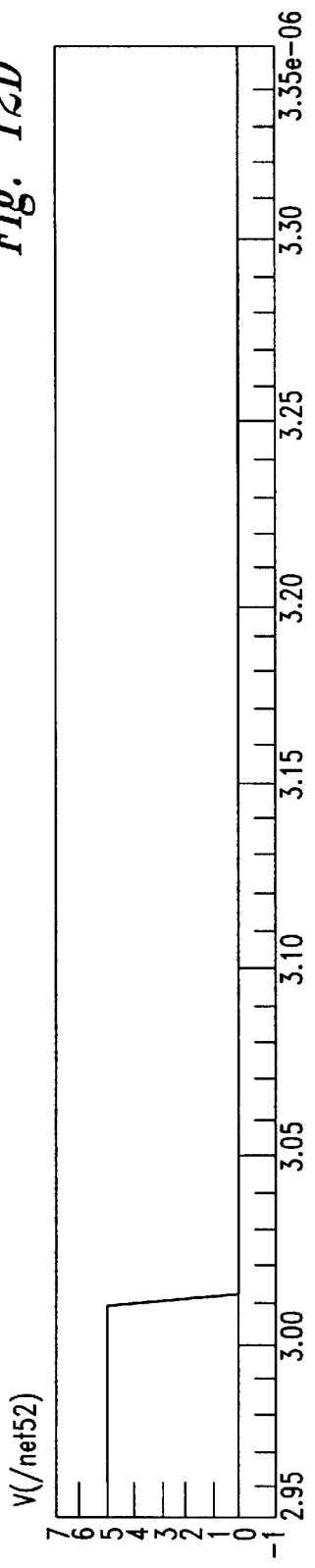
Figure 12E:
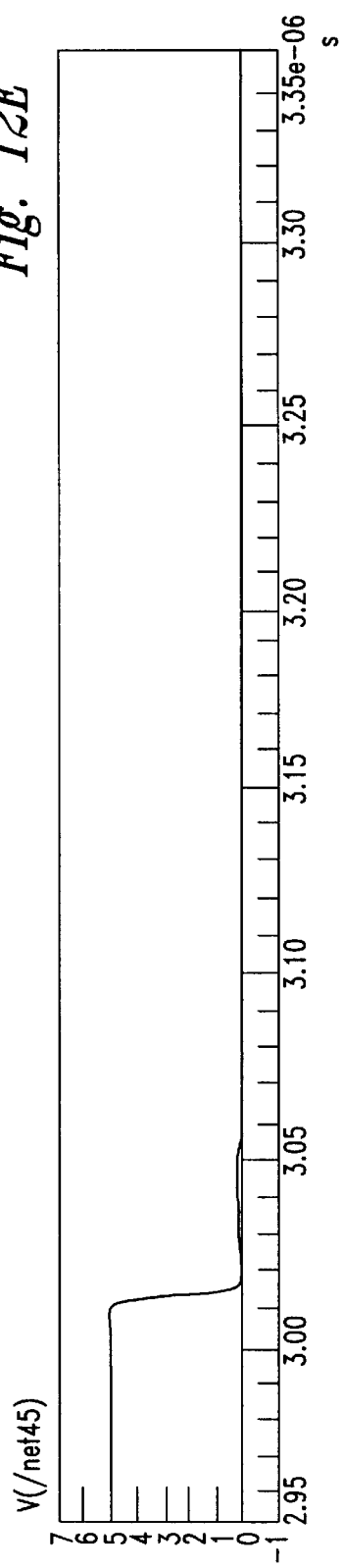
Figure 12F:
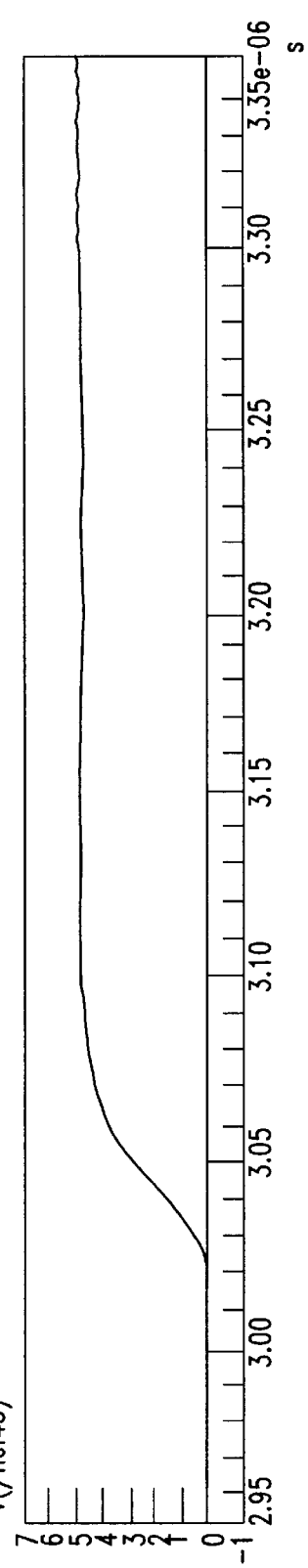

FIG. 6 shows an embodiment of inverter circuit IVS comprising inverters INV1 and INV2. Both inverters are each constituted by a CMOS series connection connected between the supply voltage terminals VDDP and VSSP and comprising a P-channel transistor QP1 and QP2, respectively, and an N-channel transistor QN1 and QN2, respectively. The gates of all four transistors QP1, QN1, QP2 and QN2 are connected jointly to an input terminal in. A connection point between QP1 and QN1 constitutes an inverter output out1 of inverter 1, and a connection point between QP2 and QN2 constitutes an inverter output out2 of second inverter INV2. QP1 and QN2 are designed as rapid switching transistors with low on-state forward resistance, whereas QN1 and QP2 are designed as slow switching transistors with high on-state forward resistance.

The mode of operation of the circuit shown in FIG. 2 shall now be elucidated in more detail with reference to FIGS. 7 to 13.

The mode of operation of the circuit shown in FIG. 2 shall be elucidated by way of the circuit diagram (FIG. 2), time diagrams (FIGS. 7, 8, 9), the stage IVS (FIG. 6), the time diagram of the on/off switching states of transistors Q1, 2, 4, 5, 8, 6, 12, 13, 11, and 10 (FIG. 10) as well as the node potential patterns (FIGS. 11 A–F and FIGS. 13 A–F) in exemplary manner:

a) The condition present during a period of time t1 in FIGS. 7 to 10 (outsel1=outse12=0) shall be considered as an initial state.

At the node inout, a level VDDP corresponding to the positive potential is driven via Q10 (Vout1=Vout2=1). The circuit operates statically, i.e.,, if no current is tapped at the node inout, the overall current consumption is zero. During this period, Q10 has its gate connected via the path Q7/Q6-Q4-Q2 to the potential VSSP and therefore is connected through, while the gate of Q11 across Q13 is at the same potential, and thus is turned off, since Q11 is of the opposite transistor type (n-channel) to Q10 (p-channel).

b) In the following, a deactivation operation (level change from '1' to '0' at node inout) is to be described in exemplary manner, which begins with the start of a period of time t2. It is necessary therefor to reprogram the two inputs outsel1 and outsel2 of stage INV from 0 to 1 (cf. FIG. 7). The process of deactivation is to take place without hard edges and furthermore is to cause no disturbances on the supply node VDDP, VSSP (through circuit cross-currents).

Figure 13A:
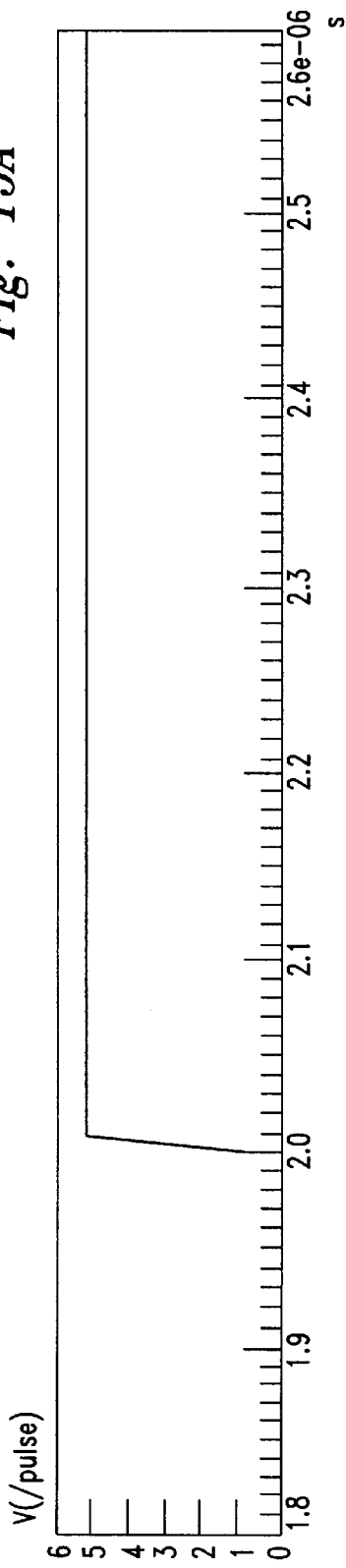
Figure 13B:
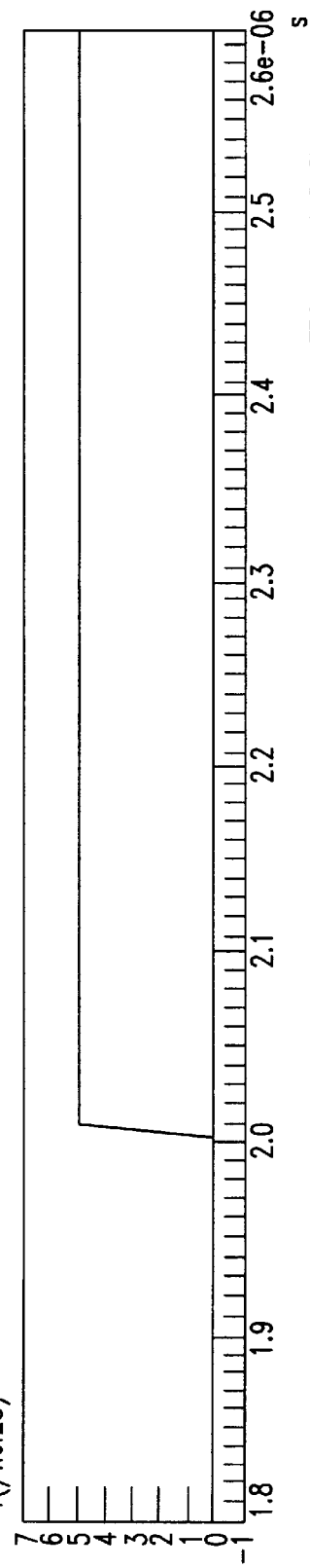

Due to the already predetermined dimensioning specifications for stage IVS and transistors Q1, Q4, Q5, Q2, Q12, Q13, respectively, the driver transistor Q10 is switched off first of all very rapidly (via Q12, cf. FIG. 13B, node 23=gate voltage Q12). For obtaining attenuated (soft) transition edges at node inout, Q11 now has to be switched on as slowly as possible, and moreover in time-shifted manner with respect to the deactivation of Q10 which should already be switched off completely before Q11 is rendered conducting (otherwise a cross-current would flow through Q10/Q11).

Figure 13C:
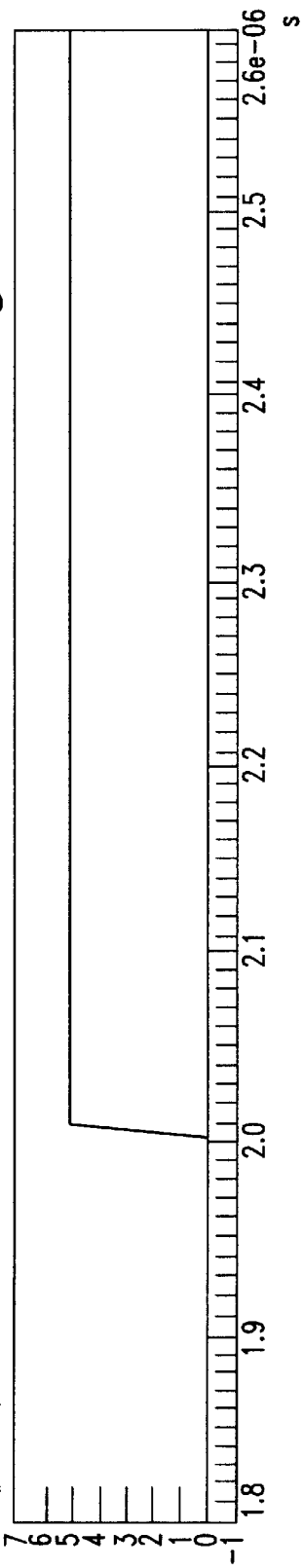

To reach this, node 52, via Q1, Q5, is controlled more slowly in the direction VDDP than network 36 (FIG. 13D), on the one hand by the asymmetrical dimensioning of stage IVS and on the other hand by the high-impedance design of Q5. Moreover, the level of network point 52 is not passed on to network point 45 (gate of Q11) as long as network point 36 has not moved at least to $Vth_n$. This holds for a series-connected transistor Q9, with $Vth_n$ being the switching-on threshold of an n-channel transistor. Q10 thus starts to switch off rapidly (FIG. 13C).

If network point 45 has reached the switching-on threshold $Vth_n$ of Q11, Q11 begins to enter into the conducting state and create a galvanic connection between inout and VSSP, i.e., to discharge node inout. Q10 is already switched off at this time.

The switching-on behavior of Q11 can be slowed down in addition through the feedback via R7-C6-S2 by the then appearing Miller effect (increase in dynamic input capacitance of the gate terminal of Q11).

Network point 45 then is charged up to VDD=$Vth_n$, which effects a current limitation and thus a soft transition edge at inout. In the steady state, network point 45 then is nevertheless charged to VDDP via Q8 and thus can offer the full driver power which in the DC case (direct current case) does not have a negative effect on the EMC behavior. Recharging and thus switching over of input is thus completed.

The switching-over operation in the opposite direction takes place in analogous manner.

What is claimed is:

1. An electric integrated circuit, comprising:

a CMOS output driver stage connected between a high-potential side supply voltage terminal receiving a first voltage and a low-potential side supply voltage terminal receiving a second voltage lower than the first voltage and having a first MOS driver transistor of one channel type and a second MOS driver transistor of the other channel type, by means of which driver pulses can be delivered to a terminal of the integrated circuit;

a control signal source delivering switching control pulses;

and a switching-on voltage reducing stage for reducing the voltage flowing through the respective first and second driver transistor to be switched on in a switching-on phase, comprising a first parallel connection and a second parallel connection each having one first MOS parallel transistor of the one channel type and one second MOS parallel transistor of the other channel type connected in parallel thereto, wherein the first parallel connection is connected between the control signal source and the gate terminal of the first driver transistor and the second parallel connection is connected between the control source and the gate terminal of the second driver transistor, wherein in each of the first and second parallel connections the gate terminal of each parallel transistor that is of the same channel type as the respective first and second driver MOS transistors belonging to the respective parallel connection, is coupled with the gate terminal of the respective first and second driver MOS transistor belonging to the respective other parallel connection, whereas a gate terminal of each respective first and second parallel transistor that is of a different channel type than the respective first and second driver MOS transistors belonging to the respective parallel connection, is connected to the same supply voltage terminal as the driver MOS transistor belonging to the respective parallel connection, and wherein the parallel transistors whose gate terminals are connected to the supply voltage terminals, in the on-state, display an on-state forward resistance of a first impedance, and the parallel transistors whose gate terminals are connected to the gate terminals of the driver transistors of the respective other parallel circuit are constituted by switching transistors of an on-state forward resistance having a second impedance lower than the first impedance.

2. The circuit of claim 1, wherein the parallel transistor of the first impedance is arranged in series connection with at least one further low-impedance MOS transistor of the first impedance and of the same channel type, which is connected as a diode, with the other parallel transistor being connected in parallel with the entire series connection.

3. The circuit of claim 2, wherein the capacity of reducing the switching-on voltage of the switching-on voltage reducing stage is programmable in that at least one of the diode transistors has a bridging switching transistor connected in parallel thereto, which according to its programmed switching state bridges or does not bridge the associated diode transistor.

4. The circuit of claim 2, wherein the capacity of reducing the switching-on voltage of the switching-on voltage reducing stage is programmable in that in at least one of the diode transistors, the gate terminal, via a program-controlled switch, can be connected either to one of the two main electrodes of this diode transistor or to the supply voltage terminal to which is connected the driver transistor belonging to the respective other parallel connection.

5. The circuit of claim 1, wherein an inverter stage and a cross-current avoiding stage following the same are connected between the control signal source and the switching-on voltage reducing stage; and the inverter stage comprises a first inverter serving for control of said first driver transistor and a second inverter serving for control of said second driver transistor, said inverters each including a series connection of a P-channel MOS inverter transistor and an N-channel MOS inverter transistor; and wherein the cross-current avoiding stage comprises a series connection connected between the two supply voltage terminals and including a high-potential side MOS transistor of the same channel type as the high-potential side driver transistor, a low-potential side MOS transistor of the same channel type as the low-potential side driver transistor, and therebetween a third parallel connection including two MOS transistors of different channel type; and further wherein in accordance with the respective output signal of the inverter stage, the gate terminal of the high-potential side driver transistor is coupled to the high-potential side supply voltage terminal via the high-potential side MOS transistor, and the gate terminal of the low-potential side driver transistor is coupled to the high-potential side supply voltage terminal via the high-potential side MOS transistor and a first one of said MOS transistors of the third parallel connection, or the gate terminal of the low-potential side driver transistor is coupled to the low potential side supply voltage terminal via the low potential side MOS transistor, and the gate terminal of the high-potential side MOS transistor is connected to the low-potential side supply voltage terminal via the low-potential side MOS transistor and the second one of said MOS transistors of the third parallel connection.

6. The circuit of claim 5, wherein the first inverter controls the high-potential side MOS transistor and the second MOS transistor of the third parallel connection, and the second inverter controls the low-potential side MOS transistor and the first MOS transistor of the third parallel connection, and each of the two inverters, with respect to its transistors, is dimensioned asymmetrically such that the first inverter performs rapid switching on, but slow switching off, of the second MOS transistor of the third parallel connection as well as slow switching on, but rapid switching-off, of the high-potential side MOS transistor, and such that the second inverter performs rapid switching on, but slow switching off, of the first MOS transistor of the third parallel connection as well as slow switching on, but rapid switching off, of the low-potential side MOS transistor.

7. The circuit of claim 6, wherein in each of the two inverters, the MOS transistor responsible for rapid switching has a ratio of channel width to channel length resulting in a low on-state forward resistance, and the MOS transistor responsible for slow switching has a ratio of channel width to channel length resulting in an on-state forward resistance of the first impedance.

8. The circuit of claim 7, wherein between the switching-on voltage reducing circuit and the output driver stage, there is connected a switch stage which, for each of the two driver transistors, comprises a switching transistor which is connected between the switching-on voltage reducing stage and the gate terminal of the respectively associated driver transistor and which is of the same channel type as the associated driver transistor, and in which the gate terminal thereof is connected to the switching control pulse source, the one main path electrode thereof is connected to a connecting line between the parallel connection belonging to the respective driver transistor and the gate terminal of this driver transistor, and the other main path electrode thereof is connected to the same supply voltage terminal as the associated driver transistor.

9. The circuit of claim 8 wherein the gate terminal of each of the two switching transistors is coupled to the one of the two inverters that serves for control of the driver transistor belonging to the respective switching transistor.

10. The circuit of claim 9, wherein the two switching transistors are dimensioned as rapid switching transistors.

11. The circuit of claim 7, wherein the high-potential side MOS transistor, the low-potential side MOS transistor and those parallel transistors whose gate terminals are coupled to the gate terminal of the driver transistor belonging to the respective other parallel connection, are dimensioned as rapid switching transistors, and the two MOS transistors of the third parallel connection and those parallel transistors whose gate terminals are coupled each with one of the two supply voltage terminals are dimensioned as slow switching transistors.

12. The circuit of claim 1 wherein the output driver stage has a switchable feedback stage associated therewith which effects reduction of the edge steepness of the driver pulses arising at the terminal.

13. The circuit of claim 12, wherein the feedback stage for each of the two driver transistors includes one Miller feedback circuit each which comprises a series connection connected between the terminal and the gate terminal of the respective driver transistor and including a feedback resistor connected to said terminal, a feedback capacitor as well as an electronic feedback switch.

14. The circuit of claim 1 wherein between the control signal source and the switching-on voltage reducing stage there is provided an RLC filter stage, which is monolithically integrated with the circuit, for reducing RF interferences occurring on the supply voltage lines of the supply voltage terminals.

15. The circuit of claim 14, wherein at least the output driver stage is adapted to be switched on/off; the terminal on the one hand has an input of a Schmitt trigger connected thereto that is adapted to be switched on/off, and on the other hand has an input of an analog switch connected thereto that is adapted to be switched on/off; and the terminal, in a switching state of the circuit in which the output driver stage is switched on and the Schmitt trigger and the analog switch are switched off, acts as output terminal for a signal direction from the control signal source to the output driver stage, and in a switching state of the circuit in which the output driver stage is switched off and the Schmitt trigger or the analog switch is switched on, acts as input terminal for a signal direction from the terminal to the Schmitt trigger or the analog switch.

16. The circuit of claim 15, wherein separate supply voltage lines are provided for each signal direction.

17. The circuit of claim 16, wherein separate supply voltage lines each are provided for a signal path via the Schmitt trigger and a signal path via the analog switch.

18. The circuit of claim 15 wherein the output driver stage is adapted to be switched on by application of identical switching control pulses to input terminals of both inverters and switched off by application of a specific combination of switching control pulses to the input terminals of both inverters.

19. The circuit of claim 15 wherein the Schmitt trigger has a controllable hysteresis region.

20. The circuit of claim 8 wherein the first driver transistor is connected to the high-potential side supply voltage terminal and the second driver transistor is connected to the low-potential side supply voltage terminal, and wherein the first driver transistor, the first parallel transistor of the second parallel connection, the second parallel transistor of the first parallel connection, the high-potential side MOS transistor and the switching transistor belonging to the first driver transistor are P-channel MOS transistors, and the second driver transistor, the first parallel transistor of the first parallel connection), the second parallel transistor of the second parallel connection, the low-potential side MOS transistor and the switching transistor belonging to the second driver transistor are N-channel MOS transistors.

* * * * *